US012635264B2

(12) United States Patent
Zhang et al.

(10) Patent No.: US 12,635,264 B2
(45) Date of Patent: May 19, 2026

(54) SOLAR CELL SHEET AND SOLAR CELL STRING GROUP

(71) Applicant: Trina Solar Co., Ltd., Changzhou (CN)

(72) Inventors: Shu Zhang, Changzhou (CN); Le Wang, Changzhou (CN)

(73) Assignee: Trina Solar Co., Ltd., Changzhou (CN)

( * ) Notice: Subject to any disclaimer, the term of this patent is extended or adjusted under 35 U.S.C. 154(b) by 0 days.

(21) Appl. No.: 18/869,940

(22) PCT Filed: Jul. 11, 2023

(86) PCT No.: PCT/CN2023/106770

§ 371 (c)(1),
(2) Date: Nov. 27, 2024

(87) PCT Pub. No.: WO2023/237128

PCT Pub. Date: Dec. 14, 2023

(65) Prior Publication Data

US 2025/0344520 A1 Nov. 6, 2025

(30) Foreign Application Priority Data

Jun. 8, 2022 (CN) .......................... 202210642487.8

(51) Int. Cl.
*H10F 19/90* (2025.01)

(52) U.S. Cl.
CPC .................................. *H10F 19/904* (2025.01)

(58) Field of Classification Search
CPC ..... H10F 19/904; H10F 77/211; H10F 77/215
See application file for complete search history.

(56) References Cited

U.S. PATENT DOCUMENTS

| 2007/0295381 A1* | 12/2007 | Fujii ..................... H10F 77/937 |
| | | 136/244 |
| 2016/0322513 A1* | 11/2016 | Martin .................. H10F 77/211 |
| 2022/0302327 A1* | 9/2022 | Geissler ................. H10F 10/14 |

FOREIGN PATENT DOCUMENTS

| CN | 206619601 U | 11/2017 |
| CN | 207651495 U | 7/2018 |

(Continued)

OTHER PUBLICATIONS

English machine translation of Chen et al. (CN 207651495) published Jul. 24, 2018.*

(Continued)

*Primary Examiner* — Christina Chern
(74) *Attorney, Agent, or Firm* — The Webb Law Firm

(57) ABSTRACT

Provided in the present disclosure are a solar cell sheet and a solar cell string group. The solar cell sheet includes a cell sheet body and a finger structure on a first surface of the cell sheet body, where the first surface of the cell sheet body is divided into a conventional region and a reinforcing region surrounding the conventional region; the finger structure includes at least four first finger lines parallel to each other, and a central segment and edge segments on both sides of the central segment of each first finger line are respectively located in the conventional region and the reinforcing region; and average cross-sectional areas of different positions of each edge segment and the central segment of each first finger line are a first area and a second area respectively; and the first area is greater than the second area.

10 Claims, 7 Drawing Sheets

(56) References Cited

FOREIGN PATENT DOCUMENTS

| | | | |
|---|---|---|---|
| CN | 112968066 A | 6/2021 | |
| CN | 115995498 A | 4/2023 | |
| KR | 20100064478 A | * 6/2010 | ........... H10F 77/703 |

OTHER PUBLICATIONS

English machine translation for Chang et al. (KR 2010-0064478) published Jun. 15, 2010.*

* cited by examiner (a)

(b)

(c)

(d)

(a)

(b)

(c)

(d)

SOLAR CELL SHEET AND SOLAR CELL STRING GROUP

This application is the United States national phase of International Patent Application No. PCT/CN2023/106770 filed Jul. 11, 2023, and claims priority to Chinese Patent Application No. 202210642487.8 filed Jun. 8, 2022, the disclosures of which are hereby incorporated by reference in their entireties.

BACKGROUND OF THE INVENTION

Field of the Invention

The present disclosure relates to the technical field of photovoltaics, and specifically relates to a solar cell sheet and a solar cell string group.

Description of Related Art

Photovoltaic energy has become an important component of the human energy structure, while a core factor driving the large-scale application of photovoltaic energy stems from the continuous drop in cost per kilowatt hour, which is further mainly benefited from the development and industrial application of those technologies that improve the efficiency and reduce the cost. However, a premise for applying these technologies is that applications of the technologies also guarantee high reliability of the component products. Therefore, the technical research of high reliability is an important technical direction to be explored by researchers of photovoltaic module and battery technologies.

The photovoltaic module having a backboard packaging structure are commonly used now, in which a thin finger slurry on a front side of the cell sheet adopts a low-unit-consumption metallization design, and the power output of the photovoltaic module will be attenuated as the service time is prolonged, especially when used in a humid environment. Therefore, how to delay the power output attenuation of the photovoltaic module is an urgent problem to be solved now.

SUMMARY OF THE INVENTION

To solve at least one of the technical problems in the existing art, the present disclosure provides a solar cell sheet and a solar cell string group which can alleviate blackening at edges of the solar cell sheet, delay increase of a line resistance of the finger lines and a contact resistance between the finger lines and a surface of the cell, and reduce the power output attenuation rate of the solar cell sheet.

To achieve the object of the present disclosure, there is provided a solar cell sheet, including a cell sheet body and a finger structure on a first surface of the cell sheet body, wherein the first surface of the cell sheet body is divided into a conventional region and a reinforcing region surrounding the conventional region;

the finger structure includes at least four first finger lines parallel to each other, and a central segment and edge segments on both sides of the central segment of each first finger line are respectively located in the conventional region and the reinforcing region; and an average cross-sectional area of different positions of each edge segment of each first finger line is a first area; an average cross-sectional area of different positions of the central segment of each first finger line is a second area; and the first area is greater than the second area.

Optionally, the finger structure further includes at least four second finger lines parallel to the first finger lines, and the at least four second finger lines are all located in the reinforcing region; and an average cross-sectional area of different positions of each second finger line is a third area, and the third area is greater than the second area.

Optionally, a ratio of the first area to the second area is greater than 1 and equal to or less than 3; and a ratio of the third area to the second area is greater than 1 and equal to or less than 3.

Optionally, the first area has a value ranging from 0.0001 to 0.001 $mm^2$; the third area has a value ranging from 0.0001 to 0.001 $mm^2$; and the second area has a value ranging from 0.000045 to 0.00075 $mm^2$.

Optionally, a distance L from an interface of the conventional region and the reinforcing region to a corresponding edge of the cell sheet body satisfies:

$$\frac{C_1}{A_1} < L < \frac{C_2}{A_1}$$

where $A_1$ is the second area; $C_1$ is a lower limit coefficient of the distance L, which is 0.0001 $mm^3$; and $C_2$ is an upper limit coefficient of the distance L, which is 0.01 $mm^3$.

Optionally, each edge segment of each first finger line has a uniform cross-sectional area at different positions.

Optionally, each edge segment of each first finger line is divided into a plurality of sub-edge segments along an extending direction thereof, each sub-edge segment has a uniform cross-sectional area at different positions, and cross-sectional areas of the plurality of sub-edge segments gradually decrease from a boundary of the reinforcing region to a corresponding interface of the conventional region and the reinforcing region.

Optionally, cross-sectional areas at different positions of each edge segment of each first finger line gradually decrease in a linear or nonlinear mode from a boundary of the reinforcing region to a corresponding interface of the conventional region and the reinforcing region.

Optionally, each second finger line has a uniform cross-sectional area at different positions.

Optionally, the finger structure further includes third finger lines parallel to the first finger lines, and at least one of the third finger lines is located in the reinforcing region, and/or a central segment and edge segments on both sides of the central segment of at least one of the third finger lines are respectively located in the conventional region and the reinforcing region; and an average cross-sectional area of different positions of each third finger line is the same as the first area.

As another technical solution, an embodiment of the present disclosure further provides a solar cell string group, including a plurality of solar cell strings, wherein each of the solar cell strings includes a plurality of solar cell sheets as provided in any of the above embodiments of the present disclosure, and the plurality of solar cell sheets are electrically connected.

The present disclosure has the following beneficial effects:

In the solar cell sheet provided in the present disclosure, the first surface of the cell sheet body is divided into a conventional region and a reinforcing region surrounding the conventional region, and an average cross-sectional area (i.e., the first area) of different positions of each edge segment of each first finger line in the reinforcing region is greater than an average cross-sectional area (i.e., the second area) of different positions of the central segment of each first finger line in the conventional region, so that the slurry unit consumption of at least part of the finger in the reinforcing region can be increased relative to the finger in the conventional region, thereby increasing the path of water vapor permeating from an outer surface to the inside of the finger line and delaying corrosion of the finger line, which further delays increase of a line resistance of the finger lines and a contact resistance between the finger lines and a surface of the cell, and reduces the power output attenuation rate of the solar cell sheet.

By adopting the solar cell sheet provided in the present disclosure, the solar cell string group of the present disclosure can delay increase of a line resistance of the finger lines and a contact resistance between the finger lines and a surface of the cell, and reduce the power output attenuation rate of the solar cell sheet.

DESCRIPTION OF THE INVENTION

To make those skilled in the art better understand the technical solutions of the present disclosure, the solar cell sheet and the solar cell string group provided in the present disclosure will be described below in detail in conjunction with the accompanying drawings.

Figure 1:
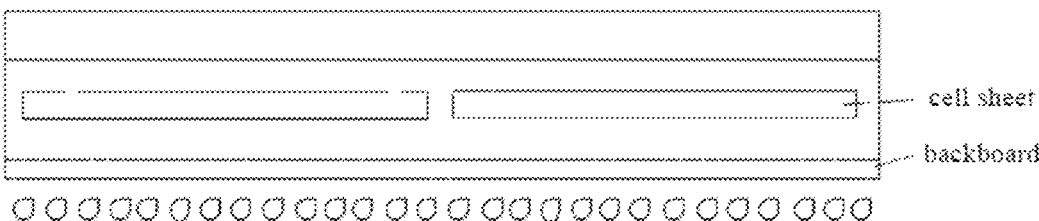
FIG. 1 is a schematic diagram of a path of water vapor permeating into modules through a backboard of a photovoltaic module in a direction perpendicular to a surface of a cell sheet.
Figure 2:
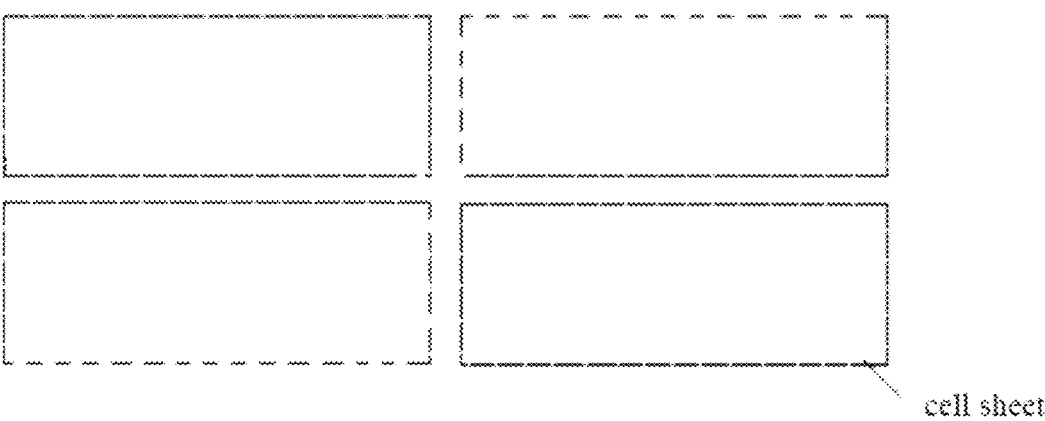
FIG. 2 is a schematic diagram of a path of water vapor permeating into modules through a backboard of a photovoltaic module in a direction parallel to a surface of a cell sheet.

The inventors have found that: the photovoltaic module having a backboard packaging structure are commonly used now, in which a thin finger slurry on a front side of the cell sheet adopts a low-unit-consumption metallization design, as shown in FIGS. 1 and 2, and as a result, when the photovoltaic module has operated in a damp and hot environment for a long time, water vapor may continuously permeate into the module through a backboard on the back side of the module, and gradually diffuse to a central region of the cell sheet along an edge of the front side through gaps between battery sheets, causing the increase of a contact resistance between the finger and the silicon wafer, as well as power output attenuation of the photovoltaic module.

Figure 3A:
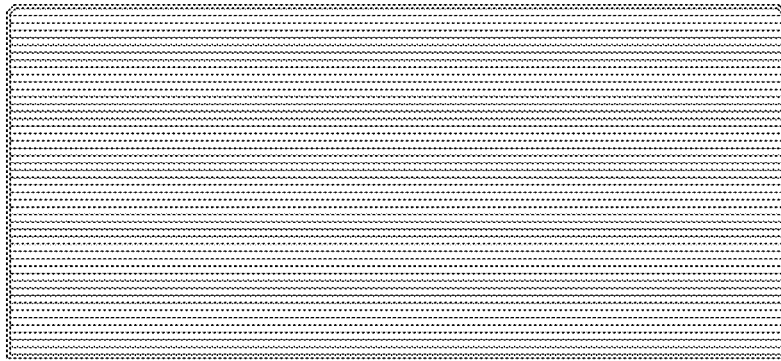
FIG. 3A is a schematic front view of one cell sheet body in a conventional solar cell sheet.
Figure 3B:
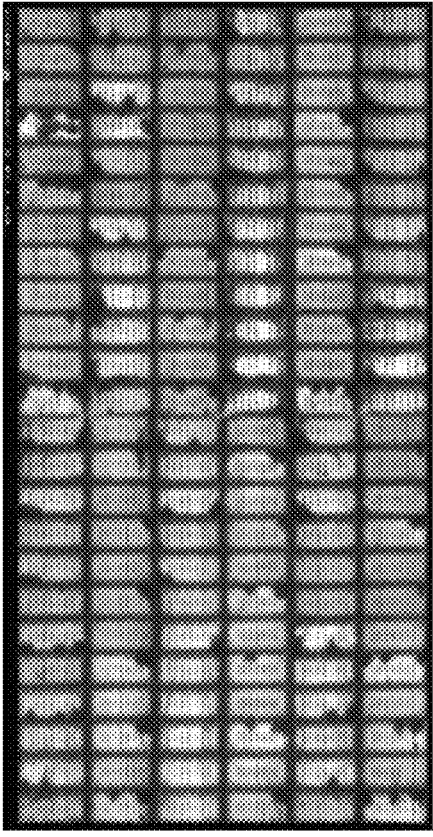
FIG. 3B is an electroluminescence chart of a conventional solar cell sheet after a damp heat test.

FIG. 3A is a schematic front view of one cell sheet body in a conventional solar cell sheet. As shown in FIG. 3A, each finger line on the cell sheet body has the same cross-sectional area at different positions. FIG. 3B is an electroluminescent (EL) picture of the solar cell sheet shown in FIG. 3A after a damp heat test. It can be clearly seen from FIG. 3B that there is obvious blackening at the edge of each cell sheet body, which is caused by high-concentration water vapor that tends to be accumulated at the edge position on the front side of the cell sheet and accelerates precipitation of an acidic component in the packaging material, causing obvious grid line corrosion at the edge position of the front side (i.e., a light receiving surface) of the cell, and thereby causing the increase of a contact resistance between the finger and the silicon wafer, as well as power output attenuation of the photovoltaic module.

Figure 4A:
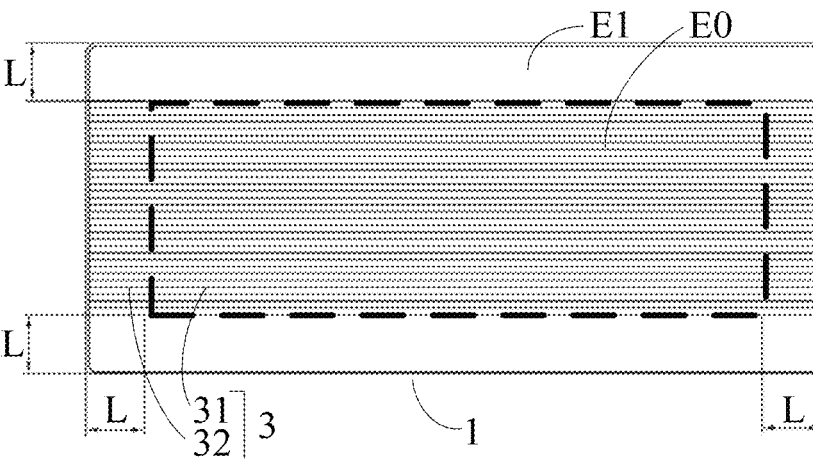
FIG. 4A is a schematic front view of one cell sheet body in a solar cell sheet according to an embodiment of the present disclosure.

To solve the above problem, referring to FIG. 4A, an embodiment of the present disclosure provides a solar cell sheet, including a cell sheet body 1 and a finger structure on a first surface of the cell sheet body 1, where the first surface is, for example, a light receiving surface (or a front side) of the cell sheet body 1. The cell sheet body 1 is the smallest cell unit of the solar cell sheet, and FIG. 4A shows only a single cell sheet body 1 and a finger structure on the first surface thereof.

The first surface of the cell sheet body 1 is divided into a conventional region E0 and a reinforcing region E1 surrounding the conventional region E0. Optionally, the conventional region E0 is a central region of the first surface, and the reinforcing region E1 is an annular edge region surrounding the central region. The finger structure includes at least four first finger lines 3 parallel to each other. A central segment 31 and edge segments 32 on both sides of the central segment 31 of each first finger line 3 are respectively located in the conventional region E0 and the reinforcing region E1. In other words, each first finger line 3 is intersected with an interface between the conventional region E0 and the reinforcing region E1, and divided into three segments.

An average cross-sectional area of different positions of the edge segment 32 of each first finger line 3 is a first area; an average cross-sectional area of different positions of the central segment 31 of each first finger line 3 is a second area; and the first area is greater than the second area. The average cross-sectional area of different positions of the edge segment 32 of each first finger line 3 refers to a quotient obtained by dividing a summed cross-sectional area of M different positions of the edge segment 32 of each first finger line 3 in an extending direction thereof by M, where M is an integer greater than 1; and the average cross-sectional area of different positions of the central segment 31 of each first finger line 3 refers to a quotient obtained by dividing a summed cross-sectional area of R different positions of the central segment 31 of each first finger line 3 in an extending direction thereof by R, where R is an integer greater than 1.

By providing the average cross-sectional area (i.e., the first area) of different positions of the edge segment 32 of each first finger line 3 in the reinforcing region greater than the average cross-sectional area (i.e., the second area) of different positions of the central segment 31 of each first finger line 3 in the conventional region E0, it is possible to only increase the slurry unit consumption of at least part of the finger in the reinforcing region E1 relative to that in the conventional region E0, while the unit consumption in the conventional region E0 remains unchanged. In other words, the average cross-sectional area of different positions of the edge segment 32 of each first finger line 3 in the reinforcing region E1 is increased. Given the same water vapor corrosion depth, the larger the average cross-sectional area, the higher the retention rate of the line resistance of the finger line and the retention rate of the surface contact resistance between the finger line and the cell sheet body 1. In other words, despite a certain degree of corrosion in the finger line in the reinforcing region E1, the line resistance and the surface contact resistance will not rise rapidly, and under the same degree of corrosion conditions, the larger the average cross-sectional area of the finger line is, the slower the line resistance and surface contact resistance rise, while the increased average cross-sectional area of the finger line can also increase the path of water vapor permeating from an outer surface to the inside of the finger line and delay corrosion of the finger line, thereby reducing the power output attenuation rate of the solar cell sheet. In addition, by providing the finger line with a smaller average cross-sectional area in the conventional region E0, the unit consumption in the conventional region E0 can be reduced, thereby reducing the cost of the cell.

Figure 4B:
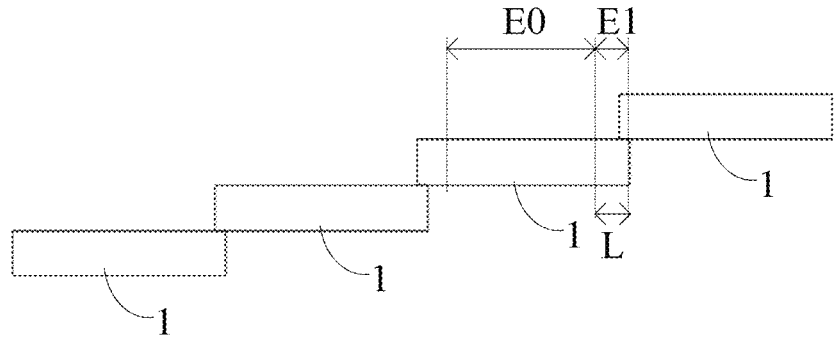
FIG. 4B is a schematic structural diagram of a cell string formed by solar cell sheets according to an embodiment of the present disclosure.

It should be noted that, in practical applications, the finger structure (including at least four first finger lines 3 parallel to each other) in FIG. 4A may be applied to a solar cell string as shown in FIG. 4B. The solar cell string in FIG. 4B is formed by a plurality of solar cell sheets bonded through stitch welding in a blank region in the reinforcing region E1 except for the regions where the edge segments 32 of the first finger lines 3 are located. This blank region is covered by another solar cell sheet and thus may play a role of isolating water vapor. In this case, the finger line may be provided, or not provided, in the blank region in the reinforcing region E1 except for the regions where the edge segments 32 of the first finger lines 3 are located.

Figure 4C:
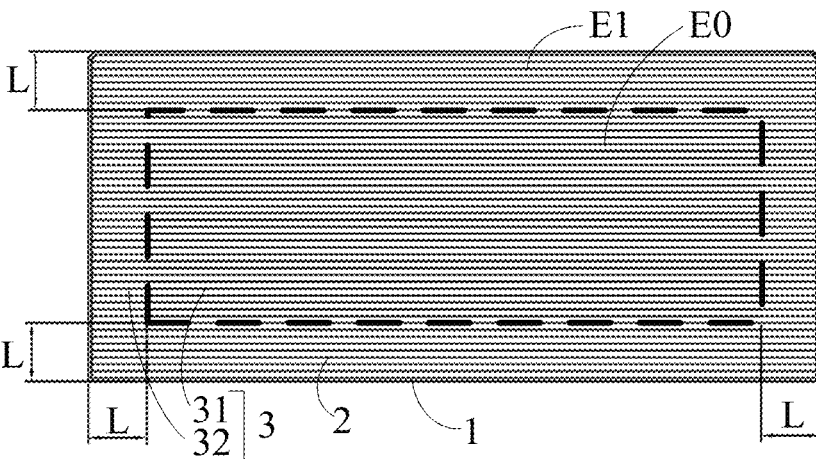
FIG. 4C is another schematic front view of one cell sheet body in a solar cell sheet according to an embodiment of the present disclosure.

In some optional embodiments, as shown in FIG. 4C, in addition to the first finger lines 3, the finger structure further includes at least four second finger lines 2 parallel to the first finger lines 3. The at least four second finger lines 2 are all located in the reinforcing region E1 (i.e., in the blank region), and each second finger line 2 is parallel to an interface between the reinforcing region E1 and the conventional region E0 closest thereto. An average cross-sectional area of different positions of each second finger line 2 is a third area, which refers to a quotient obtained by dividing a summed cross-sectional area of N different positions of each second finger line 2 in an extending direction thereof by N, where N is an integer greater than 1. The second finger lines 2 have a function of isolating water vapor in the blank region. Further, the finger structure shown in FIG. 4C may be applied to a solar cell string as shown in FIG. 4B, or applied to the solar cell string shown in FIGS. 1 and 2 (with a plurality of solar cell sheets arranged at intervals).

In some optional embodiments, a ratio of the first area to the second area is greater than 1 and equal to or less than 3; and a ratio of the third area to the second area is greater than 1 and equal to or less than 3. By setting the above ratios within such ranges, the slurry unit consumption of at least part of the finger in the reinforcing region E1 can be effectively increased, while excessive unit consumption in this region is avoided to reduce the cost the cell. Optionally, the first area has a value ranging from 0.0001 to 0.001 mm$^2$; the third area has a value ranging from 0.0001 to 0.001 mm$^2$; and the second area has a value ranging from 0.000045 to 0.00075 mm$^2$.

In some optional embodiments, a distance L from an interface of the conventional region E0 and the reinforcing region E1 to a corresponding edge (parallel to the interface line) of the cell sheet body 1 satisfies:

$$\frac{C_1}{A_1} < L < \frac{C_2}{A_1}$$

where $A_1$ is the second area (in mm$^2$); $C_1$ is a lower limit coefficient of the distance L, which is 0.0001 mm$^3$; and $C_2$ is an upper limit coefficient of the distance L, which is 0.01 mm$^3$.

By making the distance L satisfy the above relational expression, it is possible to prevent corrosion of the finger line in the conventional region E0 due to high-concentration water vapor permeating through the reinforcing region E1, and while avoiding excessive slurry unit consumption of the finger in the reinforcing region E1, thereby reducing the cost of the cell. It should be noted that the boundary of the reinforcing region E1 is typically located at a position adjacent to an edge of the cell sheet body 1, but it is needless to say that, in practical applications, the boundary of the reinforcing region E1 may coincide with the edge of the cell sheet body 1 according to specific requirements.

It should be noted that, in practical applications, the distance L may be set according to the composition, structure, size and other relevant factors of the finger line (i.e., the central segment 31 of the first finger line 3) in the conventional region E0. For example, when the finger line in the conventional region E0 has very small height and width, the distance L has to be increased accordingly; and conversely, the distance L has to be reduced accordingly; as long as the finger line in the reinforcing region E1 has a sufficient waterproof effect to prevent permeation of a relatively high concentration of water vapor. Optionally, the distance L is equal to 20 mm or 30 mm, for example.

Figure 5:
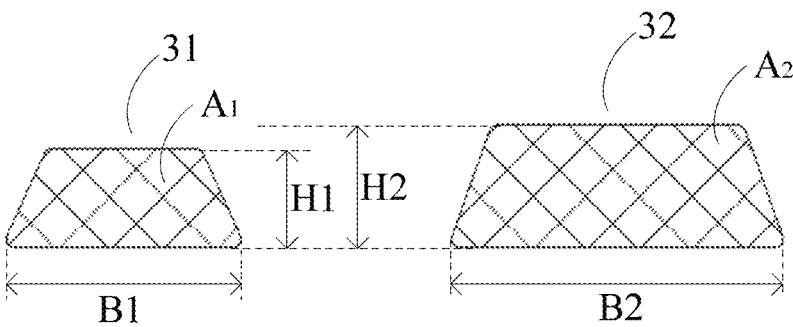
FIG. 5 is a comparison of cross-sections of a central segment and an edge segment of a first finger line according to an embodiment of the present disclosure.

The first area greater than the second area and the third area greater than the second area may be implemented in various ways, for example, by increasing the width and height of the finger line, or adopting a cross-sectional shape with a larger cross-sectional area. In a specific embodiment, as shown in FIG. 5, the central segment 31 and the edge segment 32 of the first finger line 3 each have a cross-sectional shape of an isosceles trapezoid, a width B2 of the edge segment 32 is larger than a width B1 of the central segment 31 of the first finger line 3, and a height H2 of the edge segment 32 is greater than a height H1 of the central segment 31 of the first finger line 3, thereby realizing the first area greater than the second area. The third area greater than the second area is implemented in the same manner as in this specific embodiment.

Figure 6:
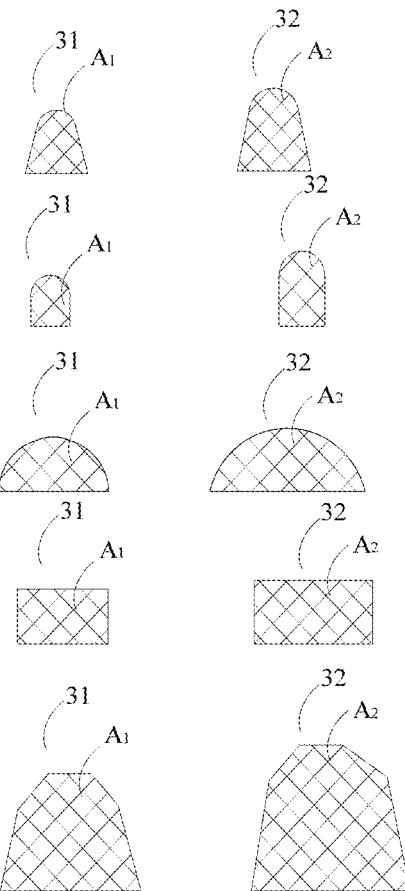
FIG. 6 is a comparison of cross-sections of different shapes of central segments and edge segments of first finger lines according to an embodiment of the present disclosure.

In some optional embodiments, the first finger lines 3 may have the same cross-sectional shape or different cross-sectional shapes; and the second finger lines 2 may have the same cross-sectional shape or different cross-sectional shapes. Moreover, in addition to the shape of an isosceles trapezoid, the cross-sectional shape may further include, but is not limited to, the five cross-sectional shapes shown in FIG. 6, in each of the cross-sectional shapes, a contour line contacting the first surface of the cell sheet body 1 may be a straight line, while shapes of a contour line not contacting the first surface may include a sine-like shape, an arc shape, a semicircular shape, a rectangular shape, an irregular polyline shape, a curved shape, a triangular shape, a polygonal shape, a combination of curved and straight lines, a curved shape, and the like, which are not particularly limited in the embodiments of the present disclosure.

Figure 7:
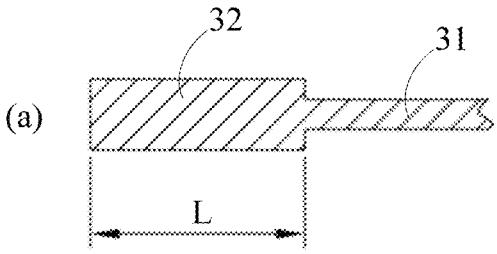
FIG. 7 is a comparison of axial sections of central segments and edge segments with different shapes of first finger lines according to an embodiment of the present disclosure.
Figure 7:
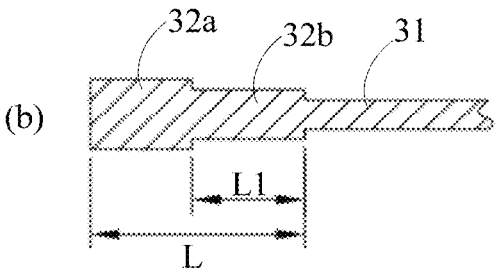
Figure 7:
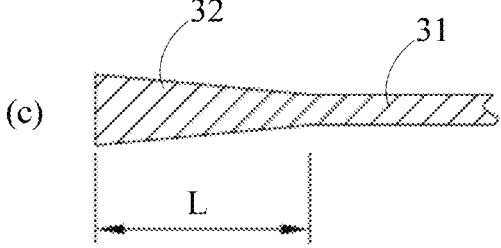
Figure 7:
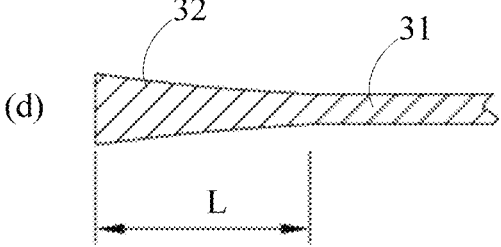
Figure 8:
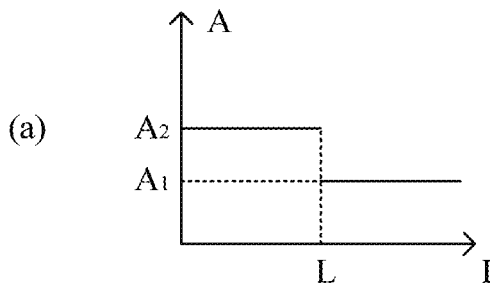
FIG. 8 is a comparison graph of cross-sectional area curves of central segments and edge segments with different shapes of first finger lines according to an embodiment of the present disclosure.
Figure 8:
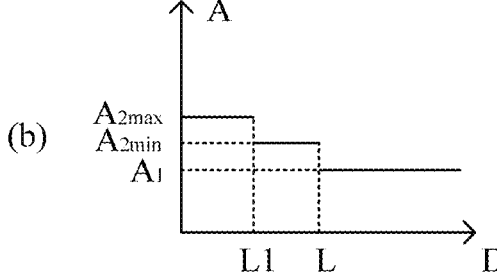
Figure 8:
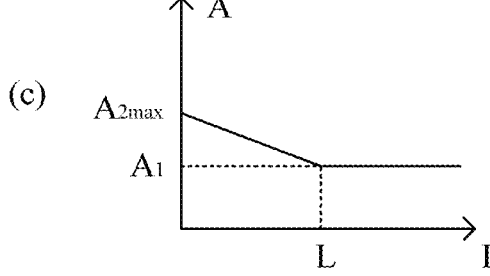
Figure 8:
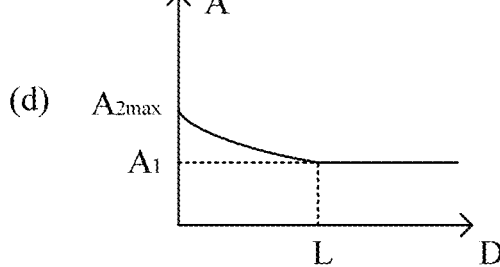

In some optional embodiments, as shown in parts (a) of FIGS. 7 and 8, the ordinate A in part (a) of FIG. 8 represents a cross-sectional area of the finger line; the abscissa D in part (a) of FIG. 8 represents a distance between different positions on any one of the finger lines and a corresponding edge of the cell sheet body 1. In a region corresponding to D<L, the edge segment 32 of each first finger line 3 has a uniform cross-sectional area $A_2$ (i.e., the first area) at different positions; and in a region corresponding to D≥L, the central segment 31 have a uniform cross-sectional area $A_1$ (i.e., the second area) at different positions, where $A_2$ is greater than $A_1$. Optionally, $A_2/A_1$ is greater than 1 and less than or equal to 3.

Figure 9:
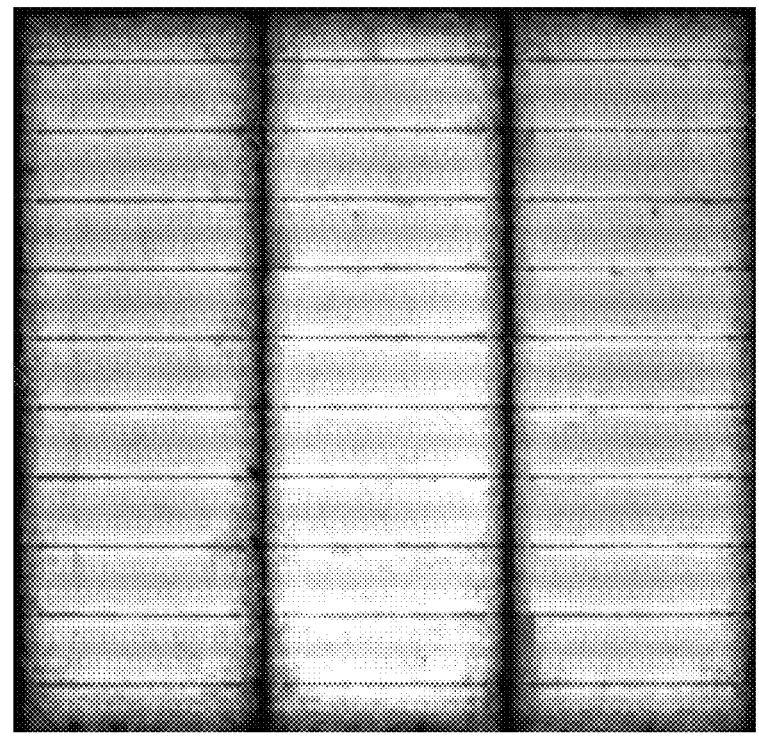
FIG. 9 is an electroluminescence chart of a solar cell sheet according to an embodiment of the present disclosure after a damp heat test.

In a specific embodiment, the distance L is 20 mm; the central segment 31 and the edge segment 32 each have a cross-sectional shape of an isosceles trapezoid, and cross-sections of different positions of the central segment 31 in the conventional region E0 have an average width of 30 μm and an average height of 6 μm; and cross-sections of the edge segment 32 in the reinforcing region E1 have an average width of 35 μm and an average height of 7 μm. The cross-sections of the second finger line 2 are designed in the same manner as those of the edge segment 32, and after a periodic damp heat test is performed by the finger structure, as shown in FIG. 9, the blackening at the edge of each cell sheet body in the solar cell sheet is remarkably alleviated, and the power output attenuation of the cell sheet is reduced from the attenuation of 5% to 10% shown in FIG. 3B to be within 3%.

In other optional embodiments, cross-sectional areas at different positions of each edge segment 32 of each first finger line 3 may differ in various ways. For example, the edge segment 32 of each first finger line 3 is divided into a plurality of sub-edge segments along an extending direction thereof, where each sub-edge segment has a uniform cross-sectional area at different positions, and cross-sectional areas of the plurality of sub-edge segments gradually decrease from a boundary of the reinforcing region E1 to a corresponding interface of the conventional region E0 and the reinforcing region E1. Specifically, the ordinate A in part (b) of FIG. 8 represents a cross-sectional area of the finger line; and the abscissa D in part (b) of FIG. 8 represents a distance between different positions on any one of the finger lines and a corresponding edge of the cell sheet body 1. As shown in parts (b) of FIGS. 7 and 8, each edge segment 32 of each first finger line 3 is divided into two sub-edge segments (32a, 32b) along an extending direction thereof. In a region corresponding to D<L1, the sub-edge segment 32a has a uniform cross-sectional area $A_{2max}$ at different positions; in a region corresponding to L1≤D<L, the sub-edge segment 32b has a uniform cross-sectional area $A_{2min}$ at different positions, where $A_{2min}<A_{2max}$; and in a region corresponding to D≥L, the central segment 31 have a uniform cross-sectional area $A_1$ at different positions, where $A_{2min}$ is greater than $A_1$. Optionally, $(A_{2max}+A_{2min})/2A_1$ is greater than 1 and less than or equal to 3.

For another example, cross-sectional areas at different positions of each edge segment 32 of each first finger line 3 gradually decrease in a linear mode from a boundary of the reinforcing region E1 to a corresponding interface of the conventional region E0 and the reinforcing region E1. Specifically, the ordinate A in part (c) of FIG. 8 represents a cross-sectional area of the finger line; and the abscissa D in part (c) of FIG. 8 represents a distance between different positions on any one of the finger lines and a corresponding edge of the cell sheet body 1. As shown in parts (c) of FIGS. 7 and 8, in a region corresponding to D<L, each edge segment 32 of each first finger line 3 has the maximum cross-sectional area $A_{2max}$ on the boundary of the reinforcing region E1, and the cross-sectional areas gradually decrease in a linear mode as approaching an interface of the conventional region E0 and the reinforcing region E1. In a region corresponding to D≥L, the central segment 31 have a uniform cross-sectional area $A_1$ at different positions, where $A_{2max}$ is greater than $A_1$.

Similarly, cross-sectional areas at different positions of each edge segment 32 of each first finger line 3 may gradually decrease in a nonlinear mode from the boundary of the reinforcing region E1 to the boundary of the conventional region E0. Specifically, the ordinate A in part (d) of FIG. 8 represents a cross-sectional area of the finger line; and the abscissa D in part (d) of FIG. 8 represents a distance between different positions on any one of the finger lines and a corresponding edge of the cell sheet body 1. As shown in parts (d) of FIGS. 7 and 8, in a region corresponding to D<L, each edge segment 32 of each first finger line 3 has the maximum cross-sectional area $A_{2max}$ on the boundary of the reinforcing region E1, and the cross-sectional areas gradually decrease in a nonlinear (e.g., curved) mode as approaching an interface of the conventional region E0 and the reinforcing region E1. In a region corresponding to D<L, the central segment 31 have a uniform cross-sectional area $A_1$ at different positions, where $A_{2max}$ is greater than $A_1$.

In some optional embodiments, in order to simplify the processing steps and reduce the cost, each second finger line 2 has a uniform cross-sectional area, i.e., the third area, at different positions. Apparently, in practical applications, each second finger line 2 may have different cross-sectional areas at different positions.

In some optional embodiments, third finger lines parallel to the first finger lines 3 may be further provided, and at least one of the third finger lines may be located in the reinforcing region E1, and/or, a central segment and edge segments on both sides of the central segment of at least one of the third finger lines may be respectively located in the conventional region E0 and the reinforcing region E1. An average cross-sectional area of different positions of each third finger line is the same as the first area; that is, finger lines of lower energy consumption may be also contained in the reinforcing region E1. With the help of the third finger lines, it can be ensured that while the finger line in the reinforcing region E1 has a sufficient waterproof effect, the line arrangement density can be increased or other specific requirements can be satisfied by adding the third finger lines. Cross-sections of the third finger lines may be designed in the same manner as the cross-sections of the finger lines in the conventional region E0.

The solar cell sheet provided in the embodiments of the present disclosure may be applied to a cell sheet with a TOPCon structure, for example.

In summary, in the solar cell sheet provided in the embodiments of the present disclosure, the first surface of the cell sheet body is divided into a conventional region and a reinforcing region surrounding the conventional region, and an average cross-sectional area (i.e., the first area) of different positions of each edge segment of each first finger line in the reinforcing region is greater than an average cross-sectional area (i.e., the second area) of different positions of the central segment of each first finger line in the conventional region, so that the slurry unit consumption of at least part of the finger in the reinforcing region can be increased relative to the finger in the conventional region, thereby increasing the path of water vapor permeating from an outer surface to the inside of the finger line and delaying corrosion of the finger line, which further delays increase of a line resistance of the finger lines and a contact resistance between the finger lines and a surface of the cell, and reduces the power output attenuation rate of the solar cell sheet.

As another technical solution, an embodiment of the present disclosure further provides a solar cell string group, including a plurality of solar cell strings, each of which includes a plurality of solar cell sheets as provided in any of the above embodiments of the present disclosure, and the plurality of solar cell sheets are electrically connected (for example, connected in parallel or in series).

In some optional embodiments, the plurality of solar cell sheets may be arranged at intervals, as shown in FIGS. 1 and 2; or the plurality of solar cell sheets may be bonded through stitch welding, as shown in FIG. 4B.

In the solar cell string group provided in the embodiments of the present disclosure, the solar cell sheet provided in any of the above embodiments of the present disclosure is adopted, which can delay increase of a line resistance of the finger lines and a contact resistance between the finger lines and a surface of the cell, and reduce the power output attenuation rate of the solar cell sheet.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A solar cell sheet, comprising a cell sheet body and a finger structure on a first surface of the cell sheet body, wherein the first surface of the cell sheet body is divided into a conventional region and a reinforcing region surrounding the conventional region;

wherein the finger structure comprises at least four first finger lines parallel to each other, and a central segment and edge segments on both sides of the central segment of each first finger line are respectively located in the conventional region and the reinforcing region;

wherein an average cross-sectional area of different positions of each edge segment of each first finger line is a first area; an average cross-sectional area of different positions of the central segment of each first finger line is a second area; and the first area is greater than the second area, and wherein a distance L from an interface of the conventional region and the reinforcing region to a corresponding edge of the cell sheet body satisfies:

$$\frac{C_1}{A_1} < L < \frac{C_2}{A_1}$$

where $A_1$ is the second area; $C_1$ is a lower limit coefficient of the distance L, which is 0.0001 mm$^3$; and $C_2$ is an upper limit coefficient of the distance L, which is 0.01 mm$^3$.

2. The solar cell sheet according to claim 1, wherein the finger structure further comprises at least four second finger lines parallel to the first finger lines, and the second finger lines are all located in the reinforcing region; and an average cross-sectional area of different positions of each second finger line is a third area, and the third area is greater than the second area.

3. The solar cell sheet according to claim 2, wherein a ratio of the first area to the second area is greater than 1 and equal to or less than 3; and a ratio of the third area to the second area is greater than 1 and equal to or less than 3.

4. The solar cell sheet according to claim 3, wherein the first area has a value ranging from 0.0001 to 0.001 mm$^2$; the third area has a value ranging from 0.0001 to 0.001 mm$^2$; and the second area has a value ranging from 0.000045 to 0.00075 mm$^2$.

5. The solar cell sheet according to claim 1, wherein each edge segment of each first finger line has a uniform cross-sectional area at different positions.

6. The solar cell sheet according to claim 1, wherein each edge segment of each first finger line is divided into a plurality of sub-edge segments along an extending direction thereof, each sub-edge segment has a uniform cross-sectional area at different positions, and cross-sectional areas of the plurality of sub-edge segments gradually decrease from a boundary of the reinforcing region to a corresponding interface of the conventional region and the reinforcing region.

7. The solar cell sheet according to claim 1, wherein cross-sectional areas at different positions of each edge segment of each first finger line gradually decrease in a linear or nonlinear mode from a boundary of the reinforcing region to a corresponding interface of the conventional region and the reinforcing region.

8. The solar cell sheet according to claim 2, wherein each second finger line has a uniform cross-sectional area at different positions.

9. The solar cell sheet according to claim 1, wherein the finger structure further comprises third finger lines parallel to the first finger lines, and at least one of the third finger lines is located in the reinforcing region, and/or a central segment and edge segments on both sides of the central segment of at least one of the third finger lines are respectively located in the conventional region and the reinforcing region; and an average cross-sectional area of different positions of each third finger line is the same as the first area.

10. A solar cell string group, comprising a plurality of solar cell strings, characterized in that each of the solar cell strings comprises a plurality of solar cell sheets as claimed in claim 1, and the plurality of solar cell sheets are electrically connected.

* * * * *